(12) United States Patent
Yoshida et al.

(10) Patent No.: US 10,410,106 B2
(45) Date of Patent: Sep. 10, 2019

(54) ATTACHMENT TAG AND TAG SYSTEM

(71) Applicant: NIPPON MEKTRON, LTD., Tokyo (JP)

(72) Inventors: Akio Yoshida, Tokyo (JP); Mitsunori Sasaki, Tokyo (JP)

(73) Assignee: NIPPON MEKTRON, LTD., Tokyo (JP)

( * ) Notice: Subject to any disclaimer, the term of this patent is extended or adjusted under 35 U.S.C. 154(b) by 0 days.

(21) Appl. No.: 16/042,682

(22) Filed: Jul. 23, 2018

(65) Prior Publication Data

US 2019/0050701 A1  Feb. 14, 2019

(30) Foreign Application Priority Data

Aug. 9, 2017 (JP) ................. 2017-154065

(51) Int. Cl.
| | |
|---|---|
| *G06K 7/08* | (2006.01) |
| *G06K 19/02* | (2006.01) |
| *G06K 19/06* | (2006.01) |
| *G06K 19/077* | (2006.01) |
| *G06K 19/07* | (2006.01) |
| *H05K 1/00* | (2006.01) |

(52) U.S. Cl.
CPC ..... *G06K 19/0776* (2013.01); *G06K 19/0702* (2013.01); *G06K 19/07758* (2013.01); *H05K 1/00* (2013.01)

(58) Field of Classification Search
USPC ....................... 235/451, 488, 492
See application file for complete search history.

(56) References Cited

U.S. PATENT DOCUMENTS

| | | | | |
|---|---|---|---|---|
| 6,121,880 | A * | 9/2000 | Scott ............ | B32B 17/06 340/10.1 |
| 2005/0059317 | A1* | 3/2005 | McEachen ....... | A63F 9/305 446/175 |
| 2006/0243792 | A1* | 11/2006 | Morello .......... | G06K 19/077 235/380 |
| 2007/0070366 | A1* | 3/2007 | Heydinger ....... | H04N 1/6019 358/1.9 |
| 2010/0059597 | A1* | 3/2010 | Iyengar .......... | G06K 19/06018 235/492 |
| 2011/0057042 | A1 | 3/2011 | Duggan et al. | |
| 2011/0079344 | A1* | 4/2011 | Sheu ............. | H05K 3/048 156/151 |
| 2011/0133345 | A1* | 6/2011 | Tasaki ........... | G06K 19/07749 257/783 |

(Continued)

FOREIGN PATENT DOCUMENTS

JP  2013-047969 A  3/2013

*Primary Examiner* — Tuyen K Vo
(74) *Attorney, Agent, or Firm* — Studebaker & Brackett PC

(57) ABSTRACT

An attachment tag includes a stretchable circuit board having stretchability, a stretchable wiring line provided on a first main surface of the stretchable circuit board and having stretchability, an identification signal generator connected to the stretchable wiring line and configured to generate an identification signal containing identification information, a transmitter configured to transmit the identification signal generated by the identification signal generator, and an adhesive layer provided on a second main surface, different from the first main surface, of the stretchable circuit board and exhibiting adhesiveness.

13 Claims, 5 Drawing Sheets

(56) References Cited

U.S. PATENT DOCUMENTS

| | | | |
|---|---|---|---|
| 2011/0198116 A1* | 8/2011 | Watari | B32B 18/00 |
| | | | 174/260 |
| 2011/0208648 A1* | 8/2011 | Alothaimeen | G01C 21/20 |
| | | | 705/39 |
| 2015/0144702 A1* | 5/2015 | Mei | G06K 19/0775 |
| | | | 235/488 |
| 2015/0243258 A1* | 8/2015 | Howe | G06T 11/001 |
| | | | 345/629 |
| 2016/0006123 A1* | 1/2016 | Li | H01Q 7/00 |
| | | | 343/867 |
| 2016/0148086 A1* | 5/2016 | Clarke | G06K 19/07749 |
| | | | 235/492 |
| 2016/0260005 A1* | 9/2016 | Karafotis | G06K 19/07703 |
| 2016/0338646 A1* | 11/2016 | Lee | A61B 5/6832 |

* cited by examiner

ATTACHMENT TAG AND TAG SYSTEM

CROSS-REFERENCE TO RELATED APPLICATION

This application claims priority from Japanese Patent Application No. 2017-154065 filed with the Japan Patent Office on Aug. 9, 2017, the entire content of which is hereby incorporated by reference.

BACKGROUND

1. Technical Field

The present disclosure relates to an attachment tag and a tag system.

2. Description of the Related Art

Currently, a technique regarding an attachment tag and a tag system using the attachment tag has been developed. For example, in facilities such as aquariums and theme parks, IC tags have been utilized for management of entrance and exit. The IC tags used for management of entrance and exit include, for example, an IC tag equipped with an antenna configured to transmit an identification signal and an IC chip. Each IC tag can be identified by the identification signal. According to a current system, such an IC tag is distributed to each visitor to the facility. The distributed IC tag worn by the visitor transmits a signal to an IC tag reader placed at, e.g., an entrance of the facility. The IC tag reader recognizes the identification signal indicated by the signal transmitted by the IC tag. In this manner, entrance of the visitor with the IC tag corresponding to the identification signal into the facility is recorded.

Such an IC tag is described in JP-A-2013-47969, for example. The IC tag described in JP-A-2013-47969 is configured as a bracelet-shaped wearable transceiver. The wearable transceiver is packaged in a vinyl layer forming a flexible bracelet. An antenna of the wearable transceiver also exhibits flexibility. According to description of JP-A-2013-47969, such a device may be attached not only to the wrists but also to other portions of a human body. Further, according to description of JP-A-2013-47969, the device may be attached to clothes. For example, the device may be attached to, e.g., a hem of a trouser or a dress.

In addition, according to description of JP-A-2013-47969, the transceiver communicates with multiple devices in a building. According to such a configuration, the location of an attachment target person of the transceiver in the building can be identified. Hereinafter, a person wearing the IC tag and the like will be sometimes simply referred to as an "attachment target person."

SUMMARY

An attachment tag includes a stretchable circuit board having stretchability, a stretchable wiring line provided on a first main surface of the stretchable circuit board and having stretchability, an identification signal generator connected to the stretchable wiring line and configured to generate an identification signal containing identification information, a transmitter configured to transmit the identification signal generated by the identification signal generator, and an adhesive layer provided on a second main surface, different from the first main surface, of the stretchable circuit board and exhibiting adhesiveness.

DESCRIPTION OF THE EMBODIMENTS

Figure 1:
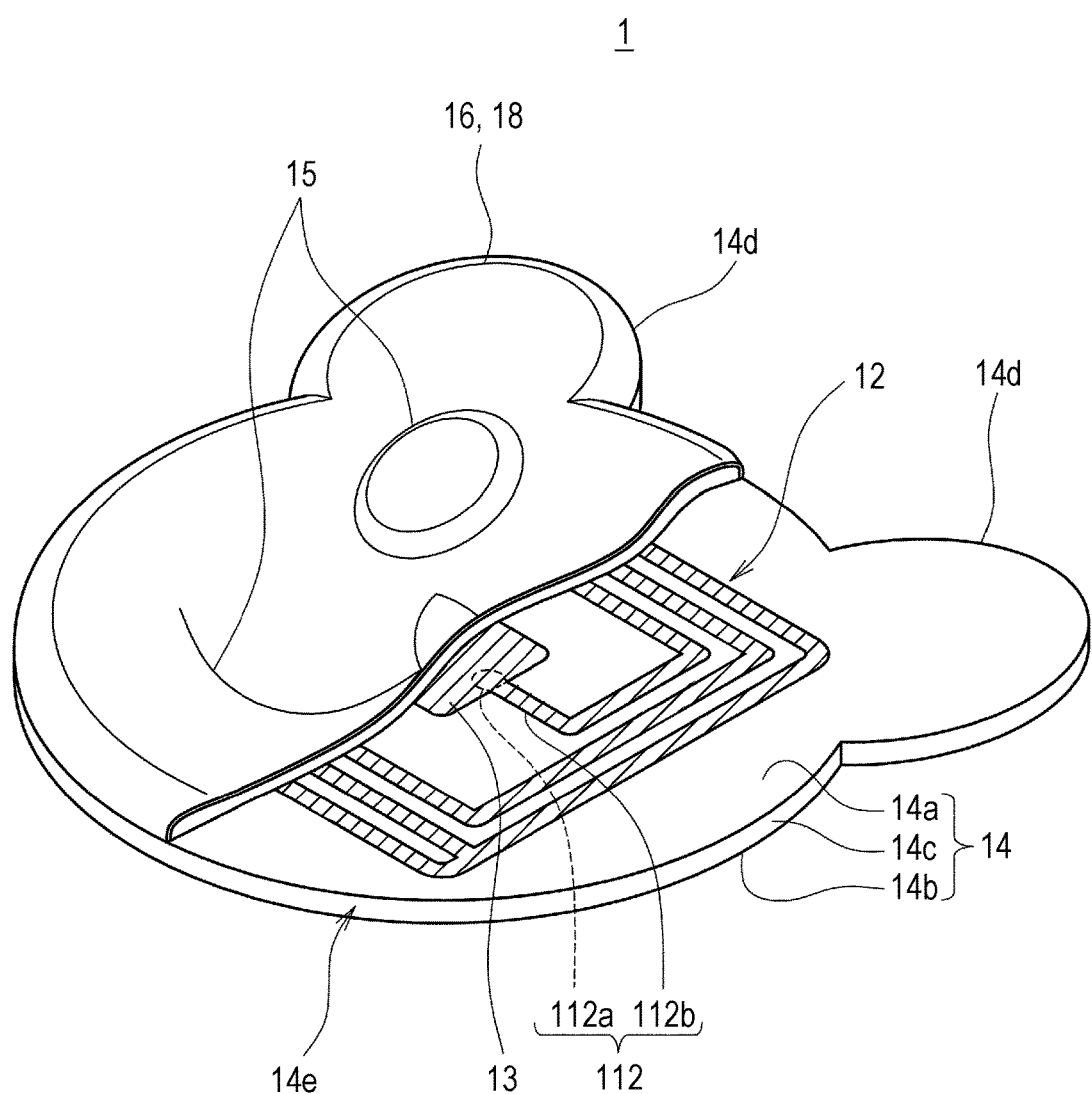
FIG. 1 is a partially-cutaway perspective view of an attachment tag according to a first embodiment of the present disclosure.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The above-described IC tag might be sometimes detached from the human body or the clothes. For example, the IC tag configured as the bracelet might be detached by the attachment target person oneself in a situation where the hand gets wet. Further, in some cases, the attachment target person forgets to wear the IC tag again after detachment. Moreover, there is a probability that the IC tag attached to the clothes is detached from the clothes before the attachment target person notices. In a case where the IC tag used for recording of entrance is detached from the attachment target person, a record of entrance of the attachment target person is lost. For this reason, it is assumed that entrance and exit cannot be smoothly managed.

Moreover, when the IC tag is detached from the attachment target person, the location of the attachment target person cannot be, needless to say, identified by use of the IC tag.

For preventing or reducing detachment of the IC tag from the attachment target person, the IC tag might be firmly attached to the attachment target person. However, in a case where the IC tag is firmly attached to the human body, there is a problem that an uncomfortable feeling of the attachment target person is increased. In a case where the IC tag is firmly attached to the clothes, the clothes might be damaged. Further, an IC tag attachment mechanism becomes complicated, and therefore, convenience in attachment and detachment might be lowered.

The present embodiment has been made in view of the above-described problems, and relates to an attachment tag configured easily attachable and detachable with a less burden on an attachment target person and a tag system using the attachment tag.

An attachment tag according to one aspect of the present disclosure includes a stretchable circuit board having stretchability, a stretchable wiring line provided on a first main surface of the stretchable circuit board and having stretchability, an identification signal generator connected to the stretchable wiring line and configured to generate an identification signal containing identification information, a transmitter configured to transmit the identification signal generated by the identification signal generator, and an adhesive layer provided on a second main surface, different from the first main surface, of the stretchable circuit board and exhibiting adhesiveness.

The attachment tag may include a battery configured to supply power to the identification signal generator. The transmitter may use the power supplied from the battery to transmit the identification signal.

The transmitter may receive a power supply signal as a signal transmitted from an outside, and transmits the identification signal by use of power obtained by the power supply signal.

The attachment tag may further include, on a side of the attachment tag opposite to the adhesive layer, a printing target layer to which ink is applied and which exhibits lower visible light permeability than that of the stretchable circuit board.

The ink may be, as a droplet, applied to the printing target layer.

The transmitter may include, on the stretchable circuit board, a portion along a shape considered to be substantially same as that of the stretchable circuit board.

A tag system according to one aspect of the present disclosure includes the above described attachment tag and a transmission device fixed at a predetermined location and configured to transmit a radio wave signal to the transmitter.

The present embodiment can provide an attachment tag (an IC tag) configured easily attachable and detachable with a less burden on an attachment target person and a tag system using the attachment tag.

Hereinafter, a first embodiment and a second embodiment of the present disclosure will be described with reference to the drawings. Note that in all drawings, similar reference numerals will be used to represent similar components. Further, overlapping description will be omitted as necessary. Moreover, in any of the first embodiment and the second embodiment, the drawings will be mainly used for describing arrangement of members of the first and second embodiments and a position relationship among the members. The drawings do not necessarily illustrate the precise dimensions and shapes of the members of the first and second embodiments, such as a length and a thickness.

First Embodiment

In the first embodiment, a case where an attachment tag is used being directly attached to, e.g., the hand skin of an attachment target person will be described by way of example. According to the first embodiment, the attachment tag is directly attached to, e.g., the hand, and therefore, motion of the attachment target person is not limited due to attachment of the attachment tag. Thus, according to the first embodiment, the attachment target person can move around without awareness of the attachment tag. Moreover, according to the first embodiment, the attachment tag is directly attached to the skin, and therefore, is preferably disposable in teens of the aspect of good hygiene.

Note that the first embodiment is not limited to the above-described configuration. The attachment tag may be attached to clothes, a bag, a hat, a belt, or the like other than the skin. Moreover, the attachment tag is not limited to the disposable attachment tag, and may be used repeatedly.

(Attachment Tag)

Figure 2:
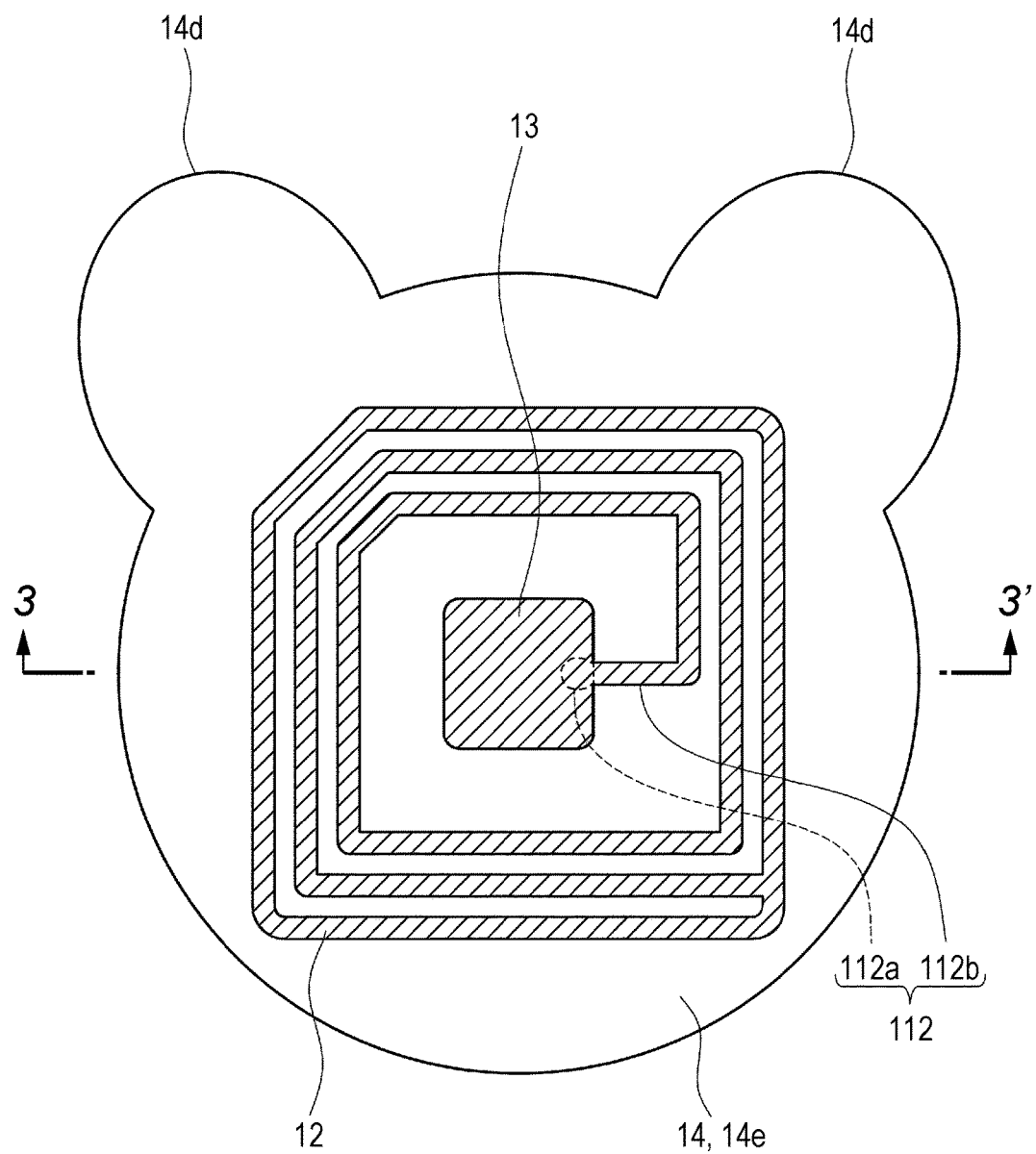
FIG. 2 illustrates, from above, the attachment tag of FIG. 1.
Figure 3:
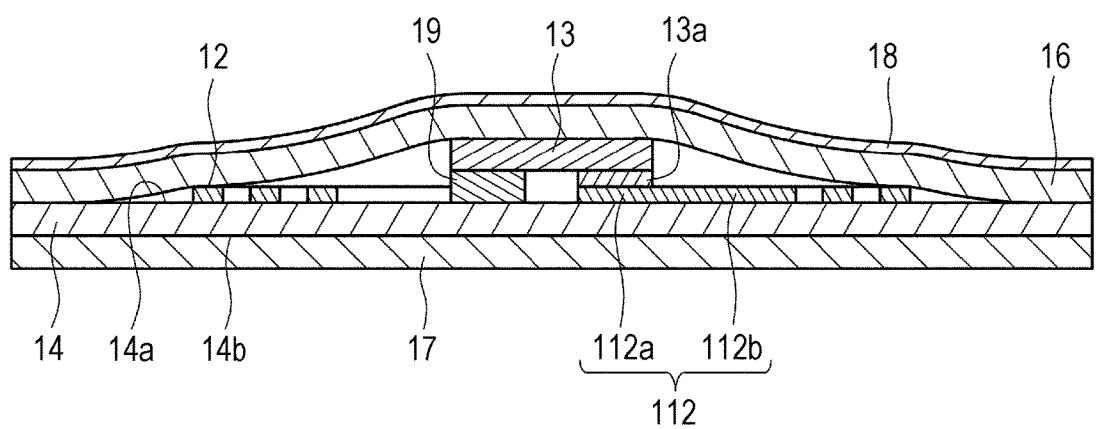
FIG. 3 is a sectional view of the attachment tag of FIG. 2 from a direction indicated by arrows 3, 3' in FIG. 2.

FIG. 1 is a partially-cutaway perspective view for describing the attachment tag according to the first embodiment. FIG. 2 illustrates, from above, the attachment tag 1 of FIG. 1 other than a stretchable cover 16. FIG. 3 is a sectional view of the attachment tag 1 from a direction indicated by arrows 3, 3' in FIG. 2.

The attachment tag 1 illustrated in FIGS. 1 to 3 has a stretchable circuit board 14, an integrated circuit (IC) 13, and an antenna 12. The stretchable circuit board 14 has stretchability. The integrated circuit is an identification signal generator. The antenna 12 is a transmitter. Further, the attachment tag 1 includes an adhesive layer 17 (FIG. 3) exhibiting adhesiveness.

Of the above-described configuration, the stretchable circuit board 14 is a sheet-shaped member. The stretchable circuit board 14 has a front surface 14a, a back surface 14b, and a peripheral surface 14c of a sheet. In the first embodiment, a surface obviously having a larger area from comparison of the front surface 14a and the back surface 14b with the peripheral surface 14c will be described as a "main surface." In the first embodiment, the front surface 14a and the back surface 14b are taken as the main surfaces.

A radio frequency identifier (RFID) antenna includes the integrated circuit 13 and the antenna 12. The integrated circuit 13 may be a compact single-chip circuit. The antenna 12 is configured in such a manner that a stretchable wiring line having stretchability is arranged optionally. The shape of the antenna 12 is not limited. In the first embodiment, a stretchable wiring portion of the antenna 12 on an extension thereof is a stretchable wiring line 112b. Further, a portion, of an end portion of the stretchable wiring line 112b, overlapping with the integrated circuit 13 is a terminal 112a. The antenna 12, the stretchable wiring line 112b, and the terminal 112a form, for example, a series of printed layer containing metal. In the first embodiment, the stretchable wiring line 112b and the terminal 112a will be collectively referred to as an "stretchable wiring portion 112."

As described above, the attachment tag 1 according to the first embodiment has the stretchable circuit board 14 having the stretchability, the stretchable wiring line 112b, the integrated circuit 13, the antenna 12, and the adhesive layer 17 (FIG. 3). The stretchable wiring line 112b is provided on the front surface 14a, and has stretchability. The front surface 14a is a first main surface of the stretchable circuit board 14. The integrated circuit 13 is connected to the stretchable wiring line 112b to generate a signal containing identification information. The antenna 12 transmits the identification signal generated by the integrated circuit 13. The adhesive layer 17 is provided on the back surface 14b, and exhibits adhesiveness. The back surface 14b is a second main surface different from the front surface 14a of the stretchable circuit board 14.

Further, the attachment tag 1 has the stretchable cover 16 on the side of the attachment tag 1 opposite to the adhesive layer 17 (FIG. 3). The stretchable cover 16 is configured to protect the antenna 12 on the stretchable circuit board 14. The stretchable cover 16 is provided on the front surface 14a (the first main surface 14a) to cover the integrated circuit 13 and the antenna 12. A printing target layer 18 is further provided on the side of the attachment tag 1 opposite to the adhesive layer 17, i.e., on an outer surface of the stretchable cover 16. Ink is applied to the printing target layer 18, and therefore, the printing target layer 18 exhibits lower visible light permeability than that of the stretchable circuit board 14. A picture 15 is drawn in the ink on the printing target layer 18.

The phrasing of "the printing target layer 18 exhibiting lower visible light permeability than that of the stretchable circuit board 14" as described herein indicates that the printing target layer 18 has a lower degree of transparency than that of the stretchable circuit board 14. Visible light permeability (light permeability) of the ink used for drawing the picture 15 on the printing target layer 18 may be lower than that of the stretchable circuit board 14. Alternatively, ink exhibiting higher visible light permeability than that of the stretchable circuit board 14 may be thickly applied such that the printing target layer 18 exhibits low visible light permeability across the entirety thereof. As another alternative, at least the front surface of the stretchable cover 16 may include a member exhibiting lower visible light permeability than that of the stretchable circuit board 14. With this configuration, the stretchable cover 16 may be used as the printing target layer 18 without the need for separately forming a layer formed as the printing target layer 18.

Hereinafter, the above-described configuration will be described sequentially.

(Stretchable Circuit Board)

The stretchable circuit board 14 is the sheet-shaped member configured stretchable at least in one of in-plane directions. The stretchable circuit board 14 is preferably stretchable in two of the in-plane directions. The stretchability of the stretchable circuit board 14 in the in-plane directions may exhibit isotropy or anisotropy. In a case where the stretchability of the stretchable circuit board 14 in the in-plane directions exhibits the anisotropy, the stretchability varies according to multiple directions in the plane of the stretchable circuit board 14. Preferably, a material contained in the stretchable circuit board 14 includes, but not limited to, an elastomer material such as nitrile rubber, latex rubber, urethane-based elastomer, or silicone-based elastomer, for example. Specifically, even in a case where the attachment tag 1 is attached to a human body skin with a urethane-based elastomer sheet for medical use, high safety can be obtained. The "sheet shape" described herein indicates a shape having a sufficiently-larger area as compared to a thickness. The thickness or area of the sheet is not specifically defined. The stretchable circuit board 14 may be formed of a single layer including a single sheet-shaped member. Alternatively, the stretchable circuit board 14 may be formed of multiple layers including multiple sheet-shaped stretchable circuit boards.

The thickness of the stretchable circuit board 14 is not specifically limited. Note that the thickness of the stretchable circuit board 14 is preferably equal to or less than 100 µm, from a viewpoint that stretching or motion of a target object (a target surface such as a living body surface) to which the stretchable circuit board 14 is attached is not inhibited. The thickness of the stretchable circuit board 14 is more preferably equal to or less than 25 µm, and much more preferably equal to or less than 10 µm.

As described above, according to the first embodiment, use of the thin sheet-shaped stretchable circuit board 14 having the stretchability does not inhibit motion of, e.g., the hand to which the attachment tag 1 is attached. Thus, an uncomfortable feeling in the hand and the like can be sufficiently reduced. Moreover, the elastomer material exhibits air permeability. Thus, the uncomfortable feeling in the hand, of the attachment target person, to which the attachment tag 1 is attached can be further reduced.

Moreover, in the first embodiment, the entirety of the stretchable circuit board 14 is formed in a geometric shape or a shape representing any of a plant, an animal, a character, and the like. As illustrated in FIGS. 1 and 2, the entirety of the stretchable circuit board 14 has a shape representing, e.g., a bear or dog face. Thus, the stretchable circuit board 14 has ear portions 14*d* and a face portion 14*e*.

(Stretchable Wiring Line, Antenna)

As described above, the stretchable wiring portion 112 and the antenna 12 form a stretchable conductive pattern formed of a continuous layer. In the first embodiment, the stretchable wiring portion 112 and the antenna 12 are formed on the outermost surface of the single-layer stretchable circuit board 14. However, the first embodiment is not limited to such a configuration. In a case where the stretchable circuit board 14 is formed of the multiple layers, the stretchable wiring portion 112 and the antenna 12 may be formed on at least one main surface of the multiple stretchable circuit boards included in the stretchable circuit board 14. Moreover, the first embodiment is not limited to the configuration in which both of the stretchable wiring portion 112 and the antenna 12 are formed on the same surface. The stretchable wiring portion 112 and the antenna 12 may be formed on different surfaces.

The stretchable wiring portion 112 includes the terminal 112*a* and the stretchable wiring line 112*b*. The terminal 112*a* is electrically connected to the integrated circuit 13. The stretchable wiring line 112*b* is arranged between the terminal 112*a* and the antenna 12. In the first embodiment, an annular portion, of the conductive pattern, relating to signal transmission will be referred to as the "antenna 12."

As illustrated in FIG. 3, the terminal 112*a* is, in contact with a terminal 13*a* of the integrated circuit 13, electrically connected to the terminal 13*a* of the integrated circuit 13. Details of the terminal 13*a* will be described later. A fixing strengthening adhesive 19 is provided between a surface of the integrated circuit 13 on which the terminal 13*a* is provided and the front surface 14*a* of the stretchable circuit board 14 while being applied to the surface of the integrated circuit 13 on which the terminal 13*a* is provided and the front surface 14*a* of the stretchable circuit board 14. With this configuration, the integrated circuit 13 is physically fixed onto the front surface 14*a*. The fixing strengthening adhesive 19 can be, for example, a highly-flexible adhesive exhibiting conductivity. With this configuration, flexibility of the attachment tag 1 is, according to the first embodiment, maintained even after adhesion of the terminal 13*a*. The terminal 112*a* and the stretchable wiring line 112*b* are preferably fused and integrated together. The antenna 12 according to the first embodiment has a shape obtained in such a manner that a line with a certain width is wound substantially three times in the plane. However, the pattern shape of the antenna 12 is not specifically limited.

The antenna 12 and the stretchable wiring portion 112 contain a conductive material. Thus, the antenna 12 and the stretchable wiring portion 112 exhibit conductivity. A material with favorable conductivity can be selected as the conductive material. The material with favorable conductivity includes, for example, silver, gold, platinum, carbon, copper, aluminum, cobalt, nickel, and alloy thereof. The shape of the conductive material is not specifically limited, but may be a particle form such as granulated powder or powder. The particle form is not specifically limited, but may be a spherical shape, a needle shape, a flake shape, a nanowire shape or the like. A particle aspect ratio may fall within a range of equal to or greater than 1 and equal to or less than 100, and specifically a range of equal to or greater than 1 and equal to or less than 50, for example. The aspect ratio described herein means the ratio between the longest dimension and the shortest dimension of a three-dimensional body. When the aspect ratio of the particle contained in the antenna 12 and the stretchable wiring portion 112 falls within a range of equal to or greater than 5 and equal to or less than 20, a change in resistance when the stretchable circuit board 14 stretched in the in-plane directions deforms in a length direction can be reduced.

The antenna 12 and the stretchable wiring portion 112 preferably further contain a resin binder. That is, the antenna 12 and the stretchable wiring portion 112 according to the first embodiment are formed with the conductive material. The conductive material is obtained in such a manner that conductive particles are dispersed in a resin material while being mixed with the resin material. Since the antenna 12 and the stretchable wiring portion 112 contain the resin binder, rupturing of the antenna 12 and the stretchable wiring portion 112 due to stretching is reduced. The resin binder includes, but not limited to, a binder containing, as a main component, resin such as urethane or polyester, and a thermoplastic elastomer material such as silicone rubber, for example. Preferably, a resin binder with a low Young's modulus is selected such that the antenna 12 and the stretchable wiring portion 112 in the form of a coating have an elastic modulus equal to or less than that of the stretchable circuit board 14. A single type of elastomer material may be used. Alternatively, a mixture of multiple types of elastomer materials may be used.

The method for manufacturing the antenna 12 and the stretchable wiring portion 112 is not specifically limited. In the first embodiment, the antenna 12 and the stretchable wiring portion 112 are formed by a printing method. That is, the antenna 12 and the stretchable wiring portion 112 are printed patterns formed in such a manner that conductive paste having stretchability is printed and applied onto the front surface 14a. The printing method is not specifically limited. The printing method may include, for example, a screen printing method, an inkjet printing method, a gravure printing method, and an offset printing method. Of these methods, screen printing is preferably used, considering fine resolution properties and film thickness stability. In the case of forming the antenna 12 and the stretchable wiring portion 112 by the printing method, conductive paste prepared to contain the above-described conductive particles, the above-described resin binder, and an organic solvent is preferably used. Stretchable conductive paste containing, as a main component, metal particles such as silver is used for the antenna 12 and the stretchable wiring portion 112, so that a stretch rate within a range of equal to or higher than about 50% and equal to or lower than about 70% can be realized, for example. Thus, a wiring line with excellent stretching properties can be formed.

The thickness and width dimensions of the antenna 12 and the stretchable wiring portion 112 can be determined based not only on resistivity under no load and a change in resistance upon stretching of the stretchable circuit board 14, but also on limitations of the thickness and width dimensions of the entirety of the stretchable circuit board 14. The width dimensions of the antenna 12 and the stretchable wiring portion 112 are preferably equal to or less than 1000 µm, more preferably equal to or less than 500 µm, and much more preferably equal to or less than 200 µm. The above-described width dimensions of the antenna 12 and the stretchable wiring portion 112 are based on the point of view that the antenna 12 and the stretchable wiring portion 112 follow a change in the dimensions upon stretching of the stretchable circuit board 14 to ensure favorable stretchability. The thickness dimensions of the antenna 12 and the stretchable wiring portion 112 may be equal to or less than 25 µm, and preferably fall within a range of equal to or greater than 10 µm and equal to or less than 15 µm.

(Integrated Circuit)

The integrated circuit 13 has the terminal 13a. The terminal 13a is a terminal provided, for electric connection with the terminal 112a, on the surface (the lower surface) of the integrated circuit 13 facing the front surface 14a of the stretchable circuit board 14. It can be also said that the terminal 13a is provided on the outside of the lower surface. The number of terminals 13a is not limited. The number of terminals 13a may be equal to the number of terminals 112a, or may be different from the number of terminals 112a.

The terminal 13a may contain the same material as that of a terminal electrode of typical electric equipment. For example, the terminal 13a is formed in such a manner that plating is performed for a terminal surface by use of gold or tin. The shape and material of the terminal 13a are not specifically limited as long as the terminal 13a can be connected to the terminal 112a (or the stretchable wiring line 112b).

In a case where the attachment tag 1 is configured as a passive tag, the antenna 12 is configured as a transmission/receiving antenna having a receiving function as well. The antenna 12 is configured to receive a signal from a tag reader (from the outside) illustrated in FIG. 4. The antenna 12 uses power obtained by the received signal to transmit the identification signal. That is, in the antenna 12, electromagnetic induction occurs due to the signal transmitted from the tag reader. By electromagnetic induction, the power is generated in the antenna 12. The antenna 12 uses the generated power to transmit the signal. Thus, the signal transmitted from the tag reader corresponds to a power supply signal according to the first embodiment. The integrated circuit 13 is configured to provide the identification information to the signal to be transmitted from the antenna 12, thereby generating the identification signal. The transmitted identification signal is received by the tag reader. The identification information of the identification signal received by the tag reader may be recorded and stored in the tag reader. Alternatively, the identification information of the identification signal received by the tag reader may be, with or without a wire, sent to a management device at an upper level from the tag reader. The identification information may contain information unique to each attachment tag 1. Alternatively, a single type of identification information may correspond to multiple attachment tags 1. As another alternative, the single attachment tag 1 (the single integrated circuit 13) may provide multiple types of identification information to the signal.

A cost for manufacturing the passive tag is lower than that for an active tag and the like. Further, the passive tag is operable substantially permanently. Because of advantages and the like of the passive tag, the passive tag has a configuration advantageous to the disposable attachment tag 1. Preferably, the tag reader has the function of transmitting a radio wave with relatively-high strength to the attachment tag 1, receiving a weak radio wave from the attachment tag 1, and analyzing the identification information provided to the radio wave (the identification signal).

The integrated circuit 13 according to the first embodiment is not limited to the configuration illustrated in FIGS. 1 to 3. For example, the integrated circuit may have a configuration in which an antenna is embedded. Note that a communicable distance of the antenna embedded in the integrated circuit is shorter than a communicable distance of an antenna provided separately from the integrated circuit.

Moreover, the attachment tag 1 according to the first embodiment is not limited to the passive tag. The attachment tag 1 can be configured as an active tag or a semi-active tag.

Note that the attachment tag configured as the active tag will be described in the second embodiment.

(Stretchable Cover)

The stretchable cover 16 is a member configured to protect the antenna 12 and the integrated circuit 13 on the stretchable circuit board 14. Thus, the stretchable cover 16 preferably exhibits cushion properties (a thickness), waterproof properties, flexibility, and elasticity. The cushion properties prevent or reduce damage to the antenna 12 and the integrated circuit 13 due to external force. The waterproof properties prevent or reduce damage to the integrated circuit 13 due to hand washing and the like. The flexibility and the elasticity allow the stretchable cover 16 to bend together with a living body to which the stretchable cover 16 is attached, and therefore, reduce the uncomfortable feeling due to attachment of the attachment tag 1. Further, for reducing the uncomfortable feeling when the tag IC is attached to the skin of the attachment target person, the stretchable cover 16 preferably exhibits air permeability for preventing or reducing the humid skin.

Such a stretchable cover 16 to be used includes, for example, a sheet member obtained in such a manner that thermoplastic elastomer resin is directly extruded and molded, and a film member. The thermoplastic elastomer resin to be used includes, for example, polyurethane resin, polyester resin, and polycarbonate resin. Of these materials, the polyurethane resin exhibits relatively high air permeability. Thus, even when the polyurethane resin is used for the attachment tag 1 to be directly attached to the skin, the uncomfortable feeling due to attachment of the attachment tag 1 can be reduced. In the first embodiment, the stretchable cover 16 is formed of a single-layer sheet containing the above-described resin or a multi-layer sheet containing the above-described resin. The thickness of the stretchable cover 16 is preferably equal to or greater than the thickness of the stretchable circuit board 14 and equal to or less than about 200 μm, for example. Because of the relatively-great thickness of the stretchable cover 16 as described above, a probability that the antenna 12 and the stretchable wiring portion 112 are degraded at the subsequent step of providing the printing target layer 18 is decreased in the attachment tag 1 according to the first embodiment. This can increase the degree of freedom in a printing process.

The stretchable cover 16 may be a single-layer sheet member formed on the antenna 12 and the integrated circuit 13. Alternatively, the stretchable cover 16 may have a multi-layer structure including a layer formed on the stretchable circuit board 14 before the integrated circuit 13 is mounted and a layer for covering the integrated circuit 13 after the integrated circuit 13 has been mounted. The layer to be used for covering the integrated circuit 13 includes, for example, a stretchable elastomer-based potting material.

Moreover, the front surface of the stretchable cover 16 can be processed. Such processing includes, for example, emboss printing, smoke processing, diffusion processing, relief printing, and antibacterial processing. In emboss printing, recessed and raised portions are formed. The smoke processing causes the components below the sheet to be less visible. The diffusion processing uses dispersed point light sources of a light emitting unit, thereby causing the stretchable cover 16 to uniformly emit light from the surface thereof. In relief printing, e.g., the outer periphery of a predetermined region is raised by printing. Further, recessed and raised portions can be also formed at the printing target layer 18 of the stretchable cover 16 by embossing.

(Printing Target Layer)

The printing target layer 18 is the layer on which the picture 15 is drawn in the applied ink. That is, the picture 15 is printed on the printing target layer 18 in the ink. In the first embodiment, the printing target layer 18 may be formed in such a manner that the picture 15 is printed on another layer formed on the stretchable cover 16. Alternatively, the printing target layer 18 may be formed as an ink layer. As another alternative, the front surface of the stretchable cover 16 on which the picture 15 is directly printed may function as the printing target layer 18 as described above.

The ink is, as droplets, applied to the printing target layer 18 according to the first embodiment. That is, the ink droplets are applied to the printing target layer 18. Such printing is available when the picture 15 is drawn on the printing target layer 18 by an inkjet method. The ink droplets on the printing target layer 18 less lower the air permeability of the stretchable cover 16. Thus, printing is preferably performed by the inkjet method. In the printing target layer 18, the ink droplets may cover the printing target layer 18 without any clearance, or may be provided on the printing target layer 18 with a clearance.

Note that the printing target layer 18 according to the first embodiment is not limited to such a configuration. For example, the printing method for the printing target layer 18 is not limited to the inkjet method. Any method such as screen printing, offset printing, letterpress printing, and gravure printing may be performed as other printing methods. Alternatively, the attachment target person may draw, by an optional method, the picture 15 on the printing target layer 18 on which a colored base is printed. The optional method includes, for example, an oil-based ink pen, a water-based ink pen, and paint. The "picture" described in the first embodiment includes an image, a mark, a figure, a chart, and a letter. Further, the picture 15 described in the first embodiment also includes bases of an image, a mark, a figure, a chart, and a letter.

Moreover, the printing target layer 18 is not limited to the outermost surface of the stretchable cover 16 as described above. For example, the stretchable cover 16 may be formed of a transparent member while a back surface of the stretchable cover 16 function as the printing target layer 18. The back surface of the stretchable cover 16 is a surface, of the stretchable cover 16, facing the stretchable circuit board 14. It can be also said that the back surface of the stretchable cover 16 is a surface, of the stretchable cover 16, opposing the stretchable circuit board 14.

(Adhesive Layer)

The adhesive layer 17 is a layer containing an adhesive selected with consideration of contact with the skin and used for an adhesive skin tape and the like. The adhesive to be used includes, for example, an acrylic-based adhesive, a rubber-based adhesive, and a silicone-based adhesive. Of these adhesives, the acrylic-based adhesive and the silicone-based adhesive exhibit excellent heat resistance, cold resistance, weather resistance, and chemical resistance, and exhibit low-allergy properties. Thus, the acrylic-based adhesive and the silicone-based adhesive are suitable as the adhesive of the adhesive layer 17. The thickness of the adhesive of the adhesive layer 17 depends on the composition and properties of the adhesive, and is preferably equal to or greater than the thickness of the stretchable circuit board 14 and equal to or less than about 200 μm. A not-shown separator may be attached to the adhesive layer 17 before the attachment tag 1 is attached to the attachment target person. The attachment tag 1 may be used after the separator has been detached.

As described above, the attachment tag 1 according to the first embodiment reduces a burden on the attachment target person. The attachment tag 1 has a small thickness. Further, the attachment tag 1 includes the substrate containing the elastomer material having the stretchability. Thus, even when the attachment tag 1 is directly attached to the skin, influence on motion of the attachment target person is prevented or reduced. In addition, the attachment tag 1 exhibits the air permeability, and therefore, the uncomfortable feeling due to attachment is reduced. Moreover, the attachment tag 1 to be used being attached to, e.g., the hand of the attachment target person is easily attachable and detachable. Thus, in the first embodiment, the attachment tag 1 can be provided, which is easily attachable and detachable with a less burden on the attachment target person.

Further, the attachment tag to be utilized in an attached state is, in many cases, preferably disposable in terms of the aspect of good hygiene. According to the attachment tag 1 including the substrate having the thin sheet member according to the first embodiment, the stretchable circuit board 14 might bend upon detachment from the hand and the like, and portions of the adhesive layer 17 sometimes stick to each other. In this case, the attachment tag 1 cannot be used again. Moreover, the attachment tag 1 including the stretchable circuit board 14, the antenna 12, and the integrated circuit 13 is inexpensive. Thus, the attachment tag 1 according to the first embodiment is obviously suitable as a disposable tag.

(Tag System)

Next, a tag system according to the first embodiment will be described.

Figure 4:
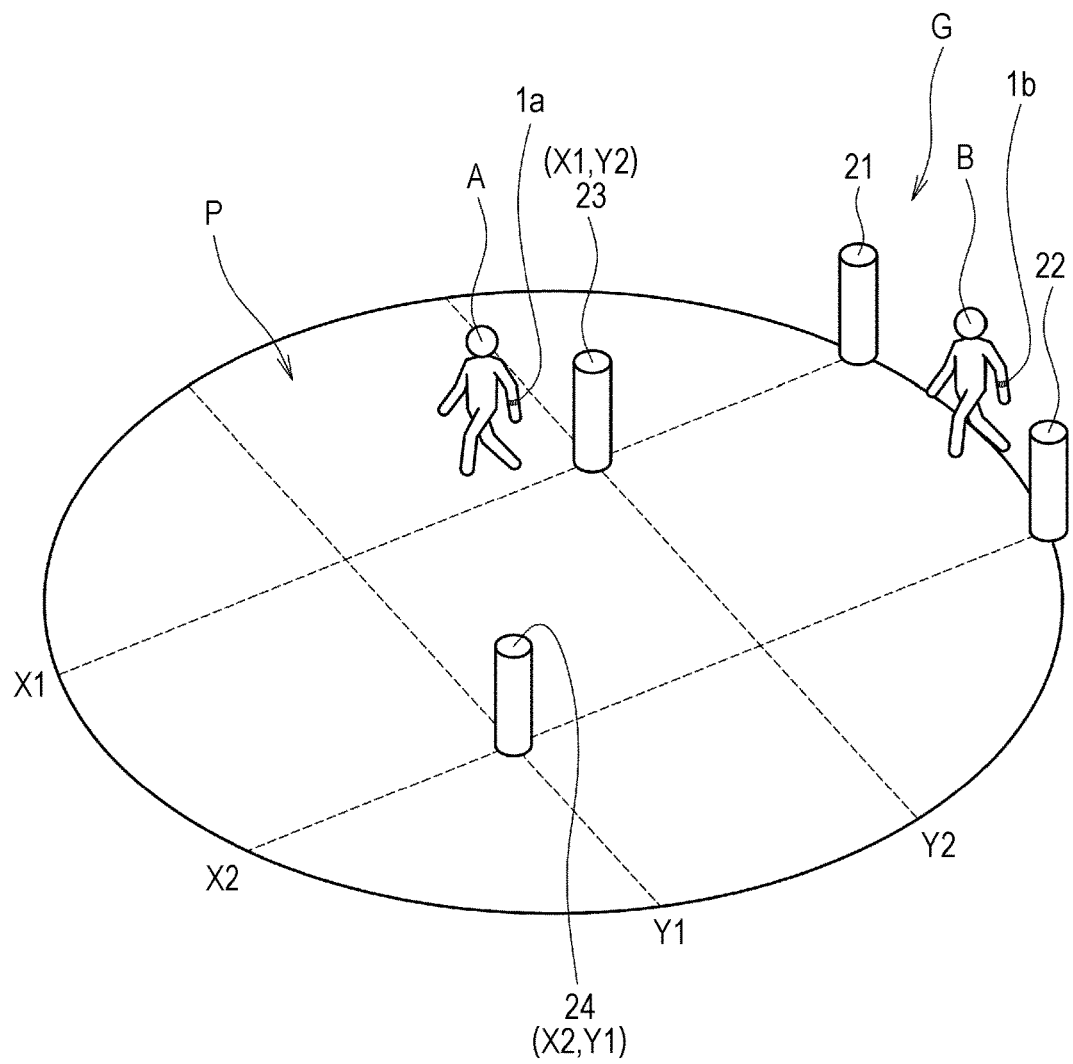
FIG. 4 is a view for describing a tag system according to the first embodiment of the present disclosure.

FIG. 4 is a view for describing the tag system according to the first embodiment of the present disclosure. In the tag system according to the first embodiment, the attachment tag 1 is used as an entrance tag of a facility P such as a theme park. The tag system according to the first embodiment is fixed at a predetermined location. Further, the tag system has tag readers as transmission devices configured to transmit radio wave signals to the antenna 12. The tag readers according to the first embodiment are provided at a gate G of the facility P and points in the facility P. In FIG. 4, the tag readers 21, 22 are placed at the gate G. Moreover, location information on an area of the facility P is provided using, e.g., coordinates X, Y. The tag reader 23 is placed at a location (X1, Y2). The tag reader 24 is placed at a location (X2, Y1).

An attachment target person A to which an attachment tag 1a is attached and an attachment target person B to which an attachment tag 1b is attached enter the facility P illustrated in FIG. 4 through the gate G. When the attachment target person B passes through the gate G as illustrated in FIG. 4, the tag reader 21 or the tag reader 22 (in this example, the tag reader 21) transmits a power supply signal to an antenna 12 of the attachment tag 1b of the attachment target person B. The antenna 12 and an integrated circuit 13 uses power generated by the transmitted power supply signal to transmit an identification signal to the tag reader 21. Identification information on the attachment tag 1b is provided to the identification signal. The tag reader 21 determines, from the identification information, whether or not entrance of the attachment tag 1b, i.e., the attachment target person B, is granted. The attachment target person B is informed about an entrance granting or non-granting result by, e.g., sound of a not-shown buzzer or illumination of a light.

Note that the tag reader 21, 22 according to the first embodiment is not limited to such a configuration. For example, the tag reader 21, 22 may transmit the identification information to the management device at the upper level without determination on acceptability of entrance of the attachment target person from the identification information. In this case, the management device may determine the acceptability of entrance of the attachment target person, and may further perform, e.g., the control of opening/closing a not-shown door of the gate G. Moreover, the tag reader 21, 22 may record and store the identification information on the IC tag having passed through the gate G. With this configuration, the tag system according to the first embodiment can easily collect information effective for management of number of visitors to the facility P, time distribution thereof, and the like.

Further, the tag system according to the first embodiment can associate the attachment tag identification information and the color and/or the picture of the printing target layer 18 with each other, for example. With this configuration, an identification signal corresponding to an attribute such as a gender and an age (an adult, a child) is transmitted to the tag reader 21, 22 from a distributed attachment tag having a color and/or a picture corresponding to the attribute. Thus, the tag system according to the first embodiment can collect information on the attribute of the visitor to the facility P, such as the gender and the age.

Moreover, the tag system illustrated in FIG. 4 can also detect passage of the attachment target person through the installation location of the tag reader 23, 24 in the facility P. Thus, the tag system according to the first embodiment can provide a stage effect such as the effect of illuminating a light or playing music in association with passage of the attachment target person through a predetermined location in the facility P. Such a stage effect can be realized in such a manner that a control signal is transmitted to a not-shown light or speaker when the tag reader 23, 24 receives the identification signal, for example. The light is configured to be turned on when receiving the control signal. The speaker is configured to play music when receiving the control signal.

Further, the tag system according to the first embodiment can associate, in advance, the attachment tag identification information and the attachment target person with each other. For example, the tag reader 23 transmits the radio wave, and receives the identification signal form the attachment tag 1a of the attachment target person A on which the transmitted radio wave has been reflected. The tag reader 23 identifies, from the identification information of the received identification signal, the attachment target person near the tag reader 23 (in a communication area of the tag reader 23). Note that the tag reader 23 may transmit the radio wave when a person passing near the tag reader 23 is detected by not-shown other sensors, for example. Alternatively, the tag reader 23 may periodically transmit the radio wave, and receive the identification signal from the attachment tag in the radio wave communication area.

As described above, according to the tag system of the first embodiment, the location of the attachment tag 1a, 1b in the facility P can be detected. The tag system according to the first embodiment can be applied to visitor paging and lost child searching. Further, the tag system according to the first embodiment can sequentially record the tag reader through which multiple attachment target persons pass, thereby identifying a movement path of the attachment target persons in the facility P. Such inform anon can be utilized as marketing information.

Second Embodiment

Next, an attachment tag according to the second embodiment of the present disclosure will be described.

Figure 5:
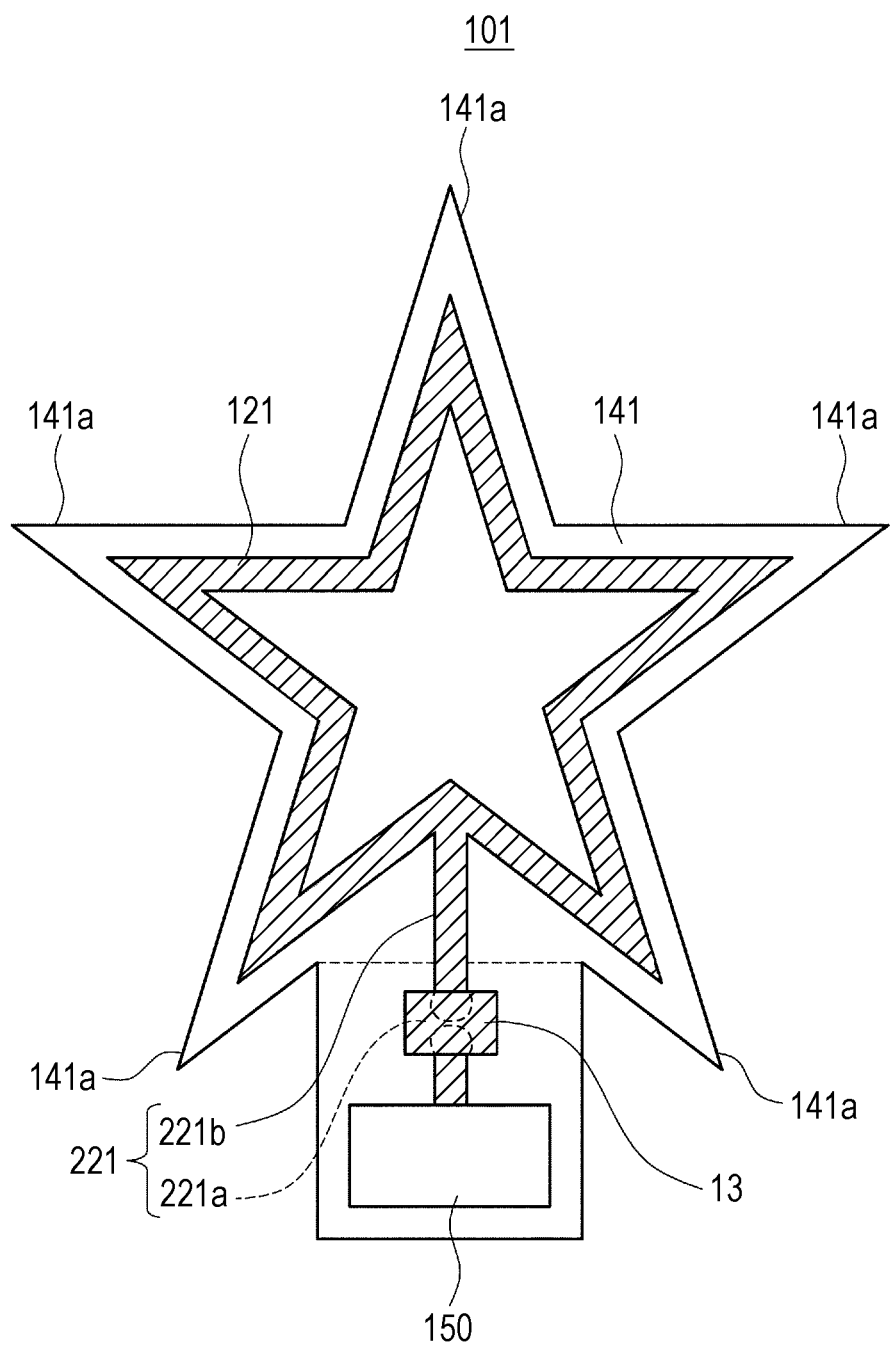
FIG. 5 is a view for describing an attachment tag according to a second embodiment of the present disclosure.

FIG. 5 is an upper view of an attachment tag 101 according to the second embodiment, a stretchable cover being removed from the attachment tag 101. The attachment tag 101 includes a stretchable circuit board 141, an antenna 121, a stretchable wiring portion 221, a not-shown stretchable cover, and an integrated circuit 13. The stretchable wiring portion 221 includes a stretchable wiring line 221b and a terminal 221a. Further, the attachment tag 101 has a battery 150. The battery 150 is configured to supply power to the integrated circuit 13 as an identification signal generator. The antenna 121 is configured to transmit an identification signal by use of the power supplied from the battery 150.

For example, a button-shaped lithium battery can be used as the battery 150. The attachment tag 101 including the built-in battery 150 can be configured as an active tag configured to actively transmit the identification signal to a tag reader. The active tag can cooperate with a sensor and the like, so that a sensor network can be built.

Further, the attachment tag 101 having the battery 150 can be configured as a semi-active tag. The semi-active tag is a tag to be activated by receiving a radio wave from the tag reader as in a passive tag while having the function of the active tag.

A material of the stretchable circuit board 141 is a material similar to that of the stretchable circuit board 14 described in the first embodiment. The stretchable circuit board 141 is a sheet member having a thickness similar to that of the stretchable circuit board 14. As in the first embodiment, the stretchable cover according to the second embodiment has, although not shown in FIG. 5, a shape similar to that of the stretchable circuit board 141, and is stacked on the stretchable circuit board 141. As illustrated in FIG. 5, the stretchable circuit board 141 has the shape of a star having five raised portions 141a. The stretchable cover according to the second embodiment also has the shape of a star having five raised portions 141a.

The antenna 121 is a conductive pattern containing a material similar to that of the antenna 12 described in the first embodiment. The stretchable wiring portion 221 includes the terminal 221a and the stretchable wiring line 221b, and is formed continuously to the antenna 121.

The antenna 121 according to the second embodiment includes, on the stretchable circuit board 141, a portion along a shape considered to be substantially same as the outer shape of the stretchable circuit board 141. The phrasing of "considered to be substantially same" as described herein means that the shape of the antenna 121 is similar to the outer shape of the stretchable circuit board 141 to such an extent that the outer shape of the stretchable circuit board 141 can be evoked. More specifically, the definition of "considered to be substantially same" includes the shape of the antenna 121 similar to that of the stretchable circuit board 141 and a state in which the antenna 121 is arranged along an outer edge portion of the stretchable circuit board 141. In an example illustrated in FIG. 5, the stretchable circuit board 141 has the star shape as viewed from above while the antenna 121 at least partially includes a portion arranged along the outer edge of the stretchable circuit board 141.

According to such a configuration of the second embodiment, a dead space of the stretchable circuit board 141 not used for arrangement of the antenna 121 can be reduced.

Further, an area for arrangement of the antenna 121 can be ensured while the attachment tag 101 is downsized. Moreover, the outer shape of the attachment tag 101 can be an optional shape such as a star shape. The attachment tag 101 can include an upper surface in the optional shape, and therefore, the attachment tag 101 can be formed in the optional shape. The optional shape of the attachment tag 101 may include, for example, a geometric shape (such as a star shape) excluding a simple circular or rectangular shape, and a shape representing a character of amination, a cartoon, a sports team, and the like. Thus, according to the second embodiment, an attachment tag with consideration of preference of an attachment target person can be provided to the attachment target person. Consequently, the attachment target person can actively wear the provided attachment tag.

The above-descried embodiments and examples include the following technical ideas:

An attachment tag of <1> includes a stretchable circuit board having stretchability, a stretchable wiring line provided on a first main surface of the stretchable circuit board and having stretchability, an identification signal generator connected to the stretchable wiring line and configured to generate an identification signal containing identification information, a transmitter configured to transmit the identification signal generated by the identification signal generator, and an adhesive layer provided on a second main surface different from the first main surface of the stretchable circuit hoard and exhibiting adhesiveness.

An attachment tag of <2> is the attachment tag of <1>, which further includes a battery configured to supply power to the identification signal generator. The transmitter uses the power supplied from the battery to transmit the identification signal.

An attachment tag of <3> is the attachment tag of <1>, in which the transmitter receives a power supply signal transmitted from an outside, and transmits the identification signal by use of power obtained by the power supply signal.

An attachment tag of <4> is the attachment tag of any one of <1> to <3>, which further includes, on a side of the attachment tag opposite to the adhesive layer, a printing target layer to which ink is applied and which exhibits lower visible light permeability than that of the stretchable circuit board.

An attachment tag of <5> is the attachment tag of <4>, in which the ink is, as droplets, applied to the printing target layer.

An attachment tag of <6> is the attachment tag of any one of <1> to <5>, in which the transmitter includes, on the stretchable circuit board, a portion along a shape considered to be substantially same as that of the stretchable circuit board.

A tag system of <7> includes the attachment tag of any one of <1> to <6>, and a transmission device fixed at a predetermined location and configured to transmit a radio wave signal to the transmitter.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. An attachment tag comprising:
a stretchable circuit board having stretchability;
a stretchable wiring line provided on a first main surface of the stretchable circuit board and having stretchability, the stretchable wiring line containing a resin binder;
an identification signal generator connected to the stretchable wiring line and configured to generate an identification signal containing identification information;
a transmitter configured to transmit the identification signal generated by the identification signal generator;
an adhesive layer provided on a second main surface, different from the first main surface, of the stretchable circuit board and exhibiting adhesiveness, and:
on a side of the attachment tag opposite to the adhesive layer, a printing target layer to which ink is applied and which exhibits lower visible light permeability than that of the stretchable circuit board.

2. The attachment tag according to claim 1, further comprising:
a battery configured to supply power to the identification signal generator, wherein
the transmitter uses the power supplied from the battery to transmit the identification signal.

3. The attachment tag according to claim 1, wherein
the transmitter receives a power supply signal as a signal transmitted from an outside, and transmits the identification signal by use of power obtained by the power supply signal.

4. The attachment tag according to claim 1, wherein
the ink is, as a droplet, applied to the printing target layer.

5. The attachment tag according to claim 1, wherein
the transmitter includes, on the stretchable circuit board, a portion along a shape considered to be substantially same as that of the stretchable circuit board.

6. A tag system comprising:
the attachment tag according to claim 1; and
a transmission device fixed at a predetermined location and configured to transmit a radio wave signal to the transmitter.

7. The attachment tag according to claim 1, further comprising a stretchable cover layer provided between the stretchable circuit board and the printing target layer with covering the stretchable wiring line.

8. The attachment tag according to claim 1, further comprising an antenna connected with the stretchable wiring line through which the identification signal having been transmitted from the transmitter is radiated.

9. The attachment tag according to claim 1, wherein
the printing target layer covers the entire top and side surfaces of the stretchable cover, and leaves the side surfaces of the stretchable circuit board exposed.

10. The attachment tag according to claim 1, wherein
the stretchable cover is transparent.

11. An attachment tag system comprising:
a stretchable circuit board having stretchability on which are provided:
a stretchable wiring line, the stretchable wiring line containing a resin binder, and
an IC element including at least an identification signal generator connected to the stretchable wiring line, and configured to generate an identification signal containing identification information, the identification signal being transmitted through a transmitter including an antenna element having been connected to the stretchable wiring line;
a stretchable cover layer configured to cover the stretchable wiring line and the IC element on the stretchable circuit board;
a printing target layer provided on the stretchable cover, a visible light permeability of which is lower than that of the stretchable circuit board;
an adhesive layer provided on a surface opposite to the surface on which both the stretchable wiring line and the IC element, and:
on a side of the attachment tag opposite to the adhesive layer, a printing target layer to which ink is applied and which exhibits lower visible light permeability than that of the stretchable circuit board.

12. The attachment tag system according to claim 11, wherein
the printing target layer covers the entire top and side surfaces of the stretchable cover, and leaves the side surfaces of the stretchable circuit board exposed.

13. The attachment tag system according to claim 11, wherein
the stretchable cover is transparent.

* * * * *